(12) United States Patent
Yanase

(10) Patent No.: US 11,592,739 B2
(45) Date of Patent: *Feb. 28, 2023

(54) PELLICLE FRAME AND PELLICLE

(71) Applicant: Shin-Etsu Chemical Co., Ltd., Tokyo (JP)

(72) Inventor: Yu Yanase, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/556,440

(22) Filed: Dec. 20, 2021

(65) Prior Publication Data

US 2022/0113624 A1    Apr. 14, 2022

Related U.S. Application Data

(63) Continuation of application No. 16/735,116, filed on Jan. 6, 2020, now Pat. No. 11,237,476.

(30) Foreign Application Priority Data

Feb. 1, 2019    (JP) .............................. JP2019-016992

(51) Int. Cl.
   *G03F 1/64*    (2012.01)
(52) U.S. Cl.
   CPC ..................... *G03F 1/64* (2013.01)
(58) Field of Classification Search
   CPC ........................................ G03F 1/64
   USPC ............................................ 430/5
   See application file for complete search history.

(56) References Cited

U.S. PATENT DOCUMENTS

| | | | |
|---|---|---|---|
| 6,303,196 B1 | 10/2001 | Funatsu | |
| 11,237,476 B2 * | 2/2022 | Yanase | ...................... G03F 1/64 |
| 2002/0090558 A1 | 7/2002 | Shirasaki | |
| 2013/0089814 A1 | 4/2013 | Kim et al. | |
| 2016/0299421 A1 | 10/2016 | Horikoshi | |
| 2018/0275508 A1 | 9/2018 | Kim et al. | |
| 2018/0314150 A1 | 11/2018 | Brouns et al. | |

FOREIGN PATENT DOCUMENTS

| | | |
|---|---|---|
| JP | 2002-182373 A | 6/2002 |
| JP | 2016-191902 A | 11/2016 |
| JP | 2016-200616 A | 12/2016 |
| JP | 2017-83791 A | 5/2017 |
| WO | WO 2009/008294 A1 | 1/2009 |
| WO | WO 2016/124536 A2 | 8/2016 |

OTHER PUBLICATIONS

Extended European Search Report for European Application No. 20153357.7, dated Jul. 8, 2020.
Japanese Office Action for Japanese Application No. 2019-016992, dated Nov. 16, 2021, with an English translation.

* cited by examiner

*Primary Examiner* — Christopher G Young
(74) *Attorney, Agent, or Firm* — Birch, Stewart, Kolasch & Birch, LLP

(57) ABSTRACT

The present invention is to provide a pellicle frame in a frame shape, having an upper end face to arrange a pellicle film thereon and a lower end face to face a photomask, and which is characterized by being provided with a notched part from an outer side face toward an inner side face of the upper end face, and to provide a pellicle characterized by including the pellicle frame as a component.

10 Claims, 3 Drawing Sheets

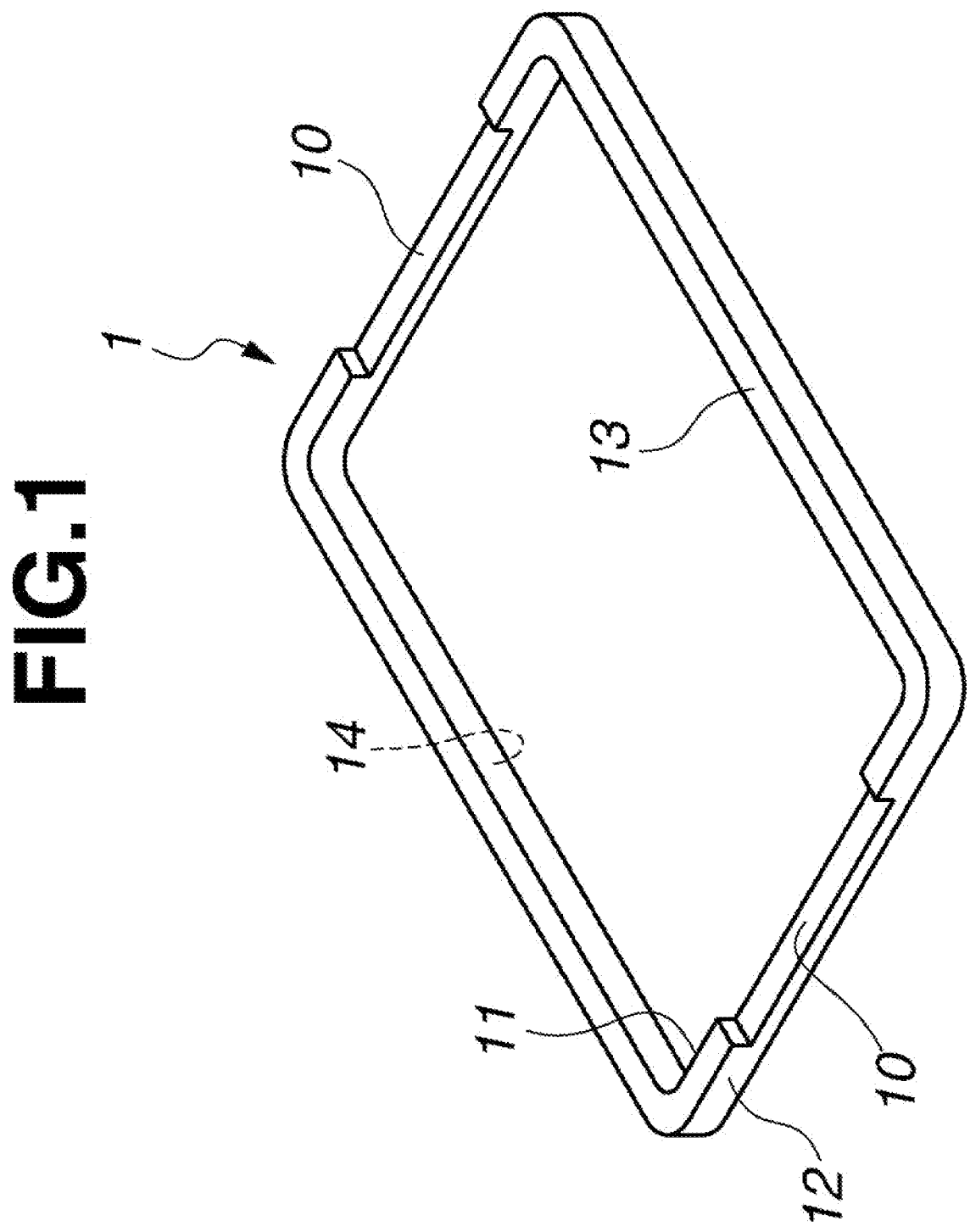

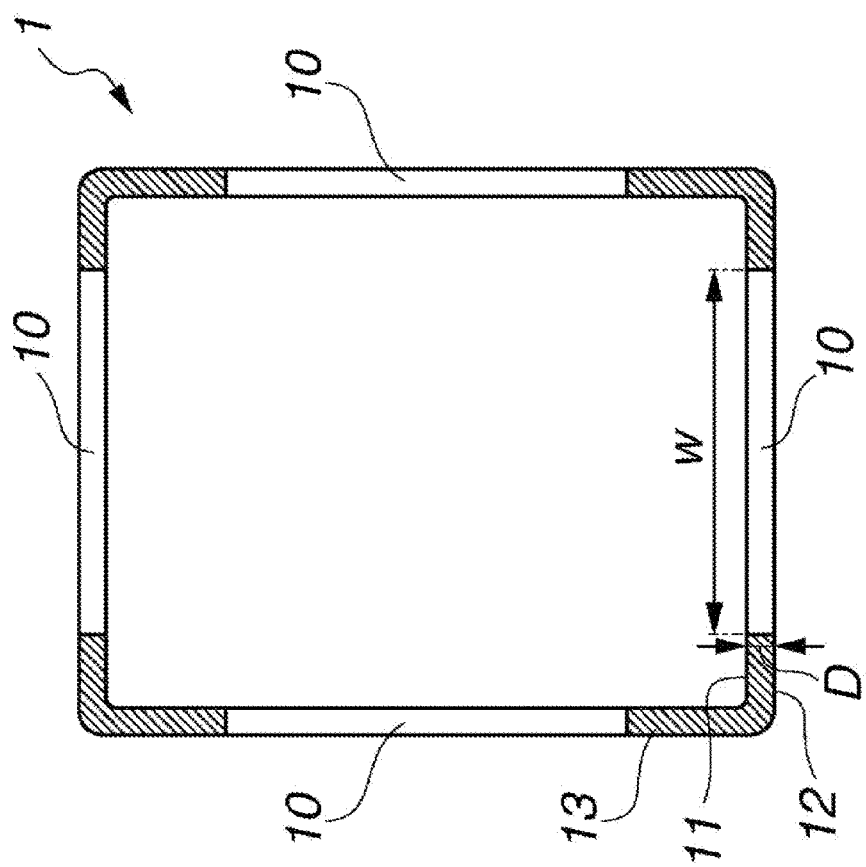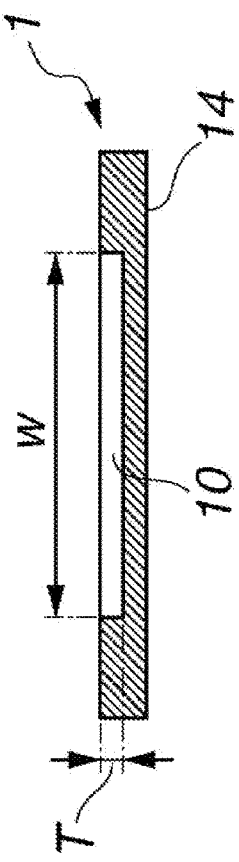
FIG.2A
FIG.2B

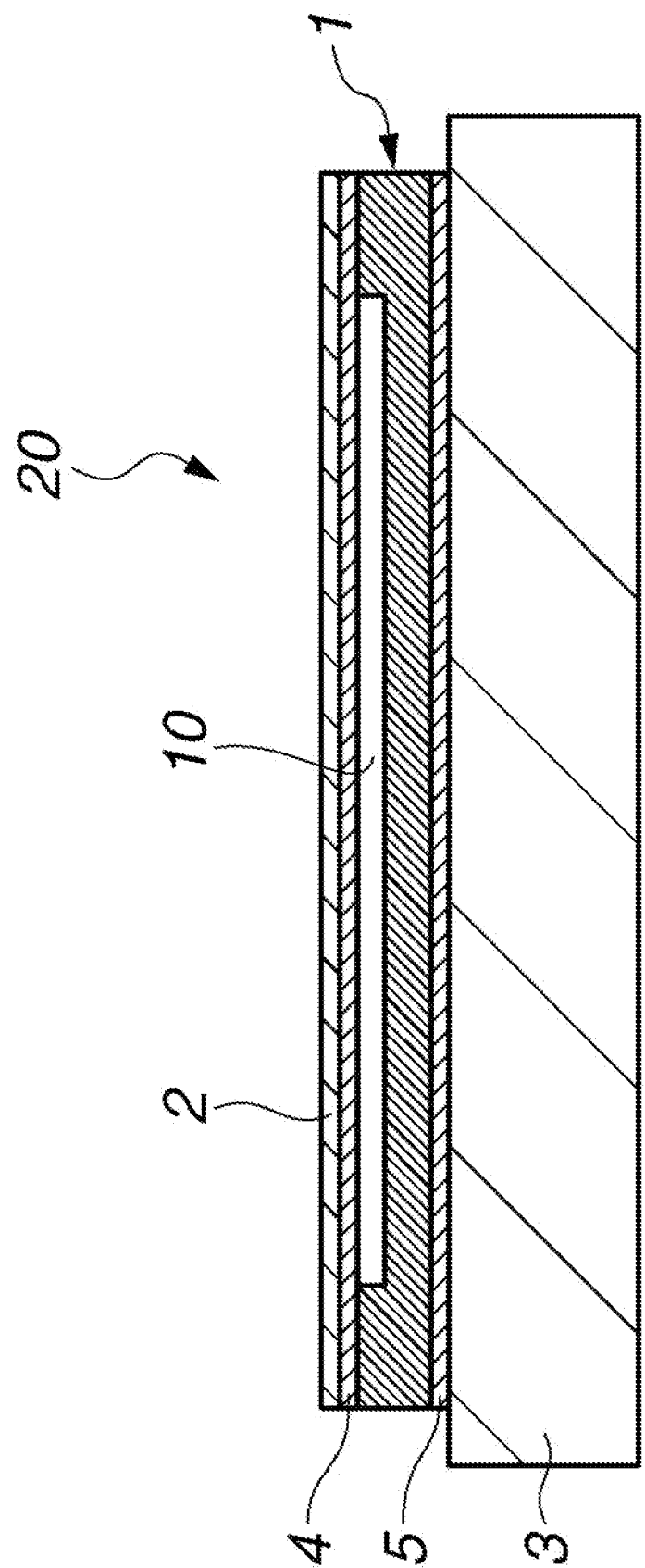

PELLICLE FRAME AND PELLICLE

CROSS-REFERENCE TO RELATED APPLICATIONS

This application is a Continuation application of application Ser. No. 16/735,116, filed on Jan. 6, 2020, now U.S. Pat. No. 11,237,476, which claims the benefit under 35 U.S.C. § 119(a) to Patent Application No. 2019-016992, filed in Japan on Feb. 1, 2019, all of which are hereby expressly incorporated by reference into the present application.

TECHNICAL FIELD

The present invention relates to a pellicle frame to be attached onto a photomask for is lithography as a dust guard, and to a pellicle.

BACKGROUND ART

In recent years, in a design rule of a large scale integration (LSI), miniaturization to sub-quarter micron has progressed, and along with the miniaturization, the wavelength of an exposure light source has been shortened. That is, the exposing light source has shifted from a g-line (436 nm) or i-line (365 nm) by a mercury lamp to a KrF excimer laser (248 mm), ArF excimer laser (193 nm) or the like, and further, extreme ultra violet (EUV) exposure using an EUV light having a main wavelength of 13.5 nm has been also studied.

In the semiconductor production of a LSI, a very large scale integration (VLSI) or the like, or in the production of a liquid crystal display board, a pattern is formed by irradiating a semiconductor wafer or an original plate for liquid crystal with light, however, if dust adheres to a photomask for lithography and a reticle (hereinafter, collectively referred to as an "exposure original plate"), which are to be used in this case, this dust absorbs light or bends light, so that there has been a problem that the transferred pattern is deformed or the edge becomes coarse, further the base becomes black and dirty, and the dimension, the quality, the appearance, or the like is impaired.

These works are usually performed in a clean room, however, it is still difficult to keep an exposure original plate clean. Accordingly, a method in which exposure is performed after attaching a pellicle as a dust guard onto a surface of an exposure original plate is generally adopted. In this case, foreign matters do not adhere directly onto a surface of an exposure original plate but adhere to a pellicle, therefore, if the focal point is set on a pattern of the exposure original plate at the time of lithography, the foreign matters on the pellicle become irrelevant to the transfer.

In the basic constitution of the pellicle, a pellicle film having a high transmittance for the light to be used for exposure is stretched on an upper end face of a pellicle frame, and further an airtight gasket is formed on a lower end face of the pellicle frame. As the airtight gasket, in general, a pressure-sensitive adhesive layer is used. The pellicle film is made of nitrocellulose, cellulose acetate, a fluorine-based polymer or the like, which well transmits the light (a g-line (436 nm) or i-line (365 nm) by a mercury lamp, a KrF excimer laser (248 nm), ArF excimer laser (193 nm) or the like) to be used for exposure, however, for EUV exposure, an ultrathin silicon film or a carbon film has been studied as a pellicle film.

There are some restrictions on a pellicle frame for EUV exposure as a matter of convenience of an exposure device. Since the pellicle arrangement space in an EUV exposure device is small, the height of a pellicle is required to be 2.5 mm or less.

In addition, since EUV exposure is performed under a high vacuum, a pellicle for EUV is required to withstand the pressure changes from an atmospheric pressure to a vacuum, and a ventilation part of the EUV pellicle is required to have a large area. In view of this, in Patent Documents 2 and 3, a pellicle frame with a filter, with which a wide ventilation area can be obtained, has been proposed. Since the height of a pellicle is low, it is preferred to provide a filter so as to be parallel to a film in order to attach the filter, and in a case where a filter is provided on an upper end face or a lower end face of a pellicle frame, a curved part is generated in a ventilation passage. If there is a curved part in a ventilation passage, particularly when the pressure is returned from a high vacuum to an atmospheric pressure, a large resistance is generated in the ventilation passage, and a pressure difference between the inside and outside of the pellicle is generated, as a result of which there has been a concern that a damage to the pellicle film may be caused. There is no problem in a case of slowly returning the pressure, and from the viewpoint of the workability, it has been found that there is a case where it may be required to return the pressure more quickly from a high vacuum to an atmospheric pressure. Further, when a pellicle frame is cleaned, it is difficult to sufficiently clean the ventilation passage having a curved part, and there has been a concern that foreign matters remain.

In Patent Document 4, a pellicle mechanically fixed to a mask with a holding spring provided on the pellicle and a fastener called a stud provided on the mask has been proposed. In that pellicle, a gap of 200 to 300 μm is created between the mask and the pellicle to perform the ventilation, and therefore the ventilation ability is sufficient, however, if the pellicle is mechanically fixed, contact between metals is necessarily generated at the connection part. If the contact between metals is generated, there is a concern that dust generation may be caused.

In the specification of Japanese Patent Application No. 2017-197004 filed previously by the applicant of the present application, a pellicle frame having a large number of through holes on the side face has been proposed. However, in such a pellicle frame, in order to provide a ventilation part having a large area with only the through holes, it is required to open an extremely large number of through holes, and in particular, if a pellicle frame is made of a material that is easily damaged, the processing is difficult, and requires a high cost. Further, in a case where foreign matters remained in the through holes due to insufficient cleaning, since the visual inspection cannot be performed in the through holes, it has been found that it is difficult to find the foreign matters inside the through holes.

In addition, in the specification of Japanese Patent Application No. 2017-19682 filed previously by the applicant of the present application, a pellicle frame in which a notched part is provided on a lower end face as a holding part of a peeling jig and further a ventilation part has been proposed. In such a pellicle frame, the ventilation ability and the processability are sufficient, however, there is a drawback that a bonded part between the pellicle frame and a mask is reduced. Because of the small bonded part, there is a concern that the pellicle frame may be dropped if the pellicle is used over a long period of time. In order to prevent the dropping of a pellicle, it is conceivable to use a pressure-sensitive adhesive having a strong adhesive force, however, the pellicle needs to be peeled off from the mask after the use or when a failure occurs in the pellicle. If the adhesive force is extremely strong, a strong force is applied to the pellicle when the pellicle is peeled off, and a possibility that the pellicle film is damaged is extremely high. If the pellicle film is damaged, the mask is contaminated, and therefore, it is difficult to use a pressure-sensitive adhesive having a strong adhesive force.

CITATION LIST

Patent Document 1: JP-A 2016-200616
Patent Document 2: JP-A 2017-83791
Patent Document 3: JP-A 2016-191902
Patent Document 4: WO 2016/124536

SUMMARY OF THE INVENTION

The present invention has been made in view of such a circumstance described above, and an object of the present invention is to provide: a pellicle frame with which when EUV exposure is performed under a high vacuum, the pellicle film withstands the pressure changes from an atmospheric pressure to a vacuum, and is not damaged, a large number of through holes are not required to be arranged, it is not difficult to find foreign matters, the pellicle film is not damaged even if an adhesive agent or pressure-sensitive adhesive having strong adhesive force is used, and a possibility that the pellicle film is peeled off is extremely low even if the pellicle frame is used over a long period of time, and a pellicle using the pellicle frame.

The present inventor has found a pellicle frame in a frame shape, having an upper end face to arrange a pellicle film thereon and a lower end face to face a photomask, with which by providing a notched part from the outer side face toward the inner side face of the upper end face of the pellicle frame, a bonded part between the pellicle frame and a pellicle film is reduced, however, since the pellicle film is not required to be peeled off from the pellicle frame, an adhesive agent or pressure-sensitive adhesive having strong adhesive force can be used, and further, since the load to be applied to the bonded par is only from the pellicle film, a possibility that the pellicle film is peeled off is extremely low even if the pellicle frame is used over a long period of time, and thus have completed the present invention.

Therefore, the present invention provides the following pellicle frame and pellicle.
1. A pellicle frame in a frame shape, having an upper end face to arrange a pellicle film thereon and a lower end face to face a photomask, and being provided with at least one notched part from an outer side face toward an inner side face of the upper end face.
2. The pellicle frame according to 1 described above, wherein the notched part is formed from the outer side face up to the inner side face.
3. The pellicle frame according to 1 described above, wherein the pellicle frame has a thickness of less than 2.5 mm, and is made of titanium.
4. The pellicle frame according to 1 described above, wherein the pellicle frame has a thickness of less than 2.5 mm, and is made of a silicon crystal.
5. A pellicle, including the pellicle frame according to 1 described above as a constituted component.
6. The pellicle according to 5 described above, wherein an adhesive agent is provided on an upper end face excluding the notched part in an upper end face of the pellicle frame.

Advantageous Effects of the Invention

According to the present invention, a pellicle frame that has sufficient ventilation ability, favorable pellicle frame processability, and favorable adhesiveness to a mask, and a pellicle can be provided.

BRIEF DESCRIPTION OF THE DRAWINGS

FIG. 1 is a perspective view showing an example of the pellicle frame according to the present invention;
FIGS. 2A and 2B show another example of the pellicle frame according to the present invention, FIG. 2A is a plan view as viewed from the upper end face side, and FIG. 2B is a plan view as viewed from the outer face side of the short side; and
FIG. 3 is a schematic view showing a state that the pellicle according to the present invention is attached onto a photomask.

DESCRIPTION OF THE PREFERRED EMBODIMENT

The pellicle frame according to the present invention is a pellicle frame in a frame shape, which has an upper end face on which a pellicle film is to be arranged and a lower end face to face a photomask.

As long as the pellicle frame has a frame shape, the shape corresponds to the shape of a photomask onto which a pellicle is to be attached. In general, the shape of a pellicle frame is a quadrilateral (rectangular or square) frame shape.

In addition, in a pellicle frame, there are a face on which a pellicle film is to be arranged (herein, referred to as an upper end face) and a face to face a photomask (herein, referred to as a lower end face) when the pellicle frame is attached onto the photomask.

In general, on the upper end face of a pellicle frame, a pellicle film is arranged with an adhesive agent or the like therebetween, and on the lower end face, a pressure-sensitive adhesive or the like for attaching a pellicle onto a photomask is provided, but cases of the present invention are not limited to the above.

The material for a pellicle frame is not limited, and a known material can be used. In a pellicle frame for EUV, since there is a possibility of being exposed to a high temperature, a material having a small thermal expansion coefficient is preferred. As the material for a pellicle frame, Si, $SiO_2$, SiN, quartz, invar, titanium, a titanium alloy, or the like can be mentioned. Among them, from the viewpoint of the ease of processing or the lightness in weight, titanium, or a titanium alloy is preferably used.

The size of a pellicle frame is not particularly limited, however, since the height of a pellicle for EUV is limited to 2.5 mm or less, the thickness of a pellicle frame for EUV is smaller than the height and is less than 2.5 mm.

In addition, the thickness of a pellicle frame for EUV is preferably 1.5 mm or less in consideration of the thickness of a pellicle film, a mask pressure-sensitive adhesive and the like.

In the pellicle frame according to the present invention, a notched part is provided from an outer side face toward an inner side face of an upper end face of the pellicle frame. Although there are no restrictions on the position to be provided with the notched part and the number of the notched parts, the total area of the opening parts is preferably 20 $mm^2$ or more, and more preferably 30 $mm^2$ or more.

In addition, usually, on a side face of a pellicle frame, a jig hole used for handling or peeling off a pellicle from a photomask is provided. The size of the jig hole is 0.5 to 1.0 mm in length (diameter in a case of a circle) in a thickness direction of the pellicle frame. The shape of the hole is not limited, and may be a circle or a rectangle. Further, usually, the jig hole is a hole that does not penetrate from an outer side face to an inner side face, and in addition to the jig hole, a vent hole that penetrates from an outer side face to an inner side face may also be provided. In a case of the vent hole, there are no restrictions on the position to be provided with the vent hole and the number of the vent holes.

In addition, a filter may be arranged in a notched part formed from an outer side face up to an inner side face of a pellicle frame. In that case, a filter may be arranged on either the inner side face or the outer side face of the pellicle frame so as to cover the notched part.

In the pellicle according to the present invention, a pellicle film is arranged on an upper end face of the pellicle frame as described above with a pressure-sensitive adhesive or an adhesive agent therebetween. The material for the pressure-sensitive adhesive or the adhesive agent is not limited, and a known material can be used. The pressure-sensitive adhesive or the adhesive agent is arranged on an upper end face excluding the notched parts of the pellicle frame. In order to strongly hold the pellicle film, a pressure-sensitive adhesive or adhesive agent having a strong adhesive force is preferred.

On the material for the pellicle film described above, there are no particular restrictions, and a material having a high transmittance and a high light resistance, at a wavelength of an exposure light source is preferred. For example, an ultrathin silicon film, a carbon film, or the like is used for EUV exposure.

Further, on a lower end face of the pellicle frame, a mask pressure-sensitive adhesive for attaching the pellicle frame onto a photomask is formed. In general, the mask pressure-sensitive adhesive is preferably arranged over the entire circumference of the pellicle frame.

As the above-described mask pressure-sensitive adhesive, a known pressure-sensitive adhesive can be used, and an acrylic pressure-sensitive adhesive or a silicone-based pressure-sensitive adhesive can be suitably used. The pressure-sensitive adhesive may be processed into an arbitrary shape as needed.

Onto a lower end face of the above-described mask pressure-sensitive adhesive, a release layer (separator) for protecting the pressure-sensitive adhesive may be attached. There are no particular restrictions on a material for the release layer, and for example, polyethylene terephthalate (PET), polytetrafluoroethylene (PTFE), tetrafluoroethylene-perfluoroalkyl vinyl ether copolymer (PFA), polyethylene (PE), polycarbonate (PC), polyvinyl chloride (PVC), polypropylene (PP), or the like can be used. Further, as needed, a release agent such as a silicone-based release agent or a fluorine-based release agent may be applied onto a surface of the release layer.

Herein, FIG. 1 shows an example of a pellicle frame 1 according to the present invention, and in each drawing, the reference sign 11 shows an inner side face of the pellicle frame, the reference sign 12 shows an outer side face of the pellicle frame, the reference sign 13 shows an upper end face of the pellicle frame, and the reference sign 14 shows a lower end face of the pellicle frame. In the upper end face of the pellicle frame 1 of FIG. 1, notched parts 10 and 10 are provided on the short sides, respectively, and not provided on the long sides, in the upper end face. In addition, usually on the long side of the pellicle frame, a jig hole used for peeling off a pellicle from a photomask is provided, however, the jig hole is not specifically shown in FIG. 1.

FIGS. 2A and 2B show an example in which in an upper end face of a pellicle frame 1, notched parts 10 and 10 are provided on the short sides in the upper end face, respectively, and further notched parts 10 and 10 are provided also on the long sides in the upper end face, respectively, that is, a total of four notched parts are provided in the upper end face. In FIGS. 2A and 2B, the notched parts are each formed by communicating from an outer side face up to an inner side face. In FIGS. 2A and 2B, the reference sign W shows a width of the notched part, the reference sign D shows a depth of the notched part, and the reference sign T shows a height of the notched part.

FIG. 3 shows a pellicle 20, and a pellicle film 2 is bonded and stretched onto an upper end face of a pellicle frame 1 by an adhesive agent 4. Further, the pellicle frame 1 is peelably bonded to a photomask 3 by a pressure-sensitive adhesive 5 to protect a pattern surface on the photomask 3.

EXAMPLES

Hereinafter, the present invention is specifically described with reference to Examples and Comparative Examples, however, the present invention is not limited to the following Examples.

Example 1

A pellicle frame (with an outer size of 150 mm×118 mm×1.5 mm, and a frame width of 4.0 mm) made of titanium (having a linear expansion coefficient of $8.4 \times 10^{-6}$ (1/K), and a density of 4.5 g/cm$^3$) was prepared.

In an outer side face of a long side of the pellicle frame, two jig holes each having a diameter of 1 mm and a depth of 1.2 mm were provided at two places each with a distance of 52 mm away from the center of the side to each of the corner directions. A notched part with a width of 90 mm, a height of 0.1 mm, and a depth of 4 mm was provided in an upper end face at the center of each of the sides of the pellicle frame. The notched part was formed from an outer side face up to an inner side face.

The pellicle frame was cleaned, and one obtained by adding 1 part by weight of a curing agent (PT-56 manufactured by Shin-Etsu Chemical Co., Ltd.) into 100 parts by weight of a silicone pressure-sensitive adhesive (X-40-3264 manufactured by Shin-Etsu Chemical Co., Ltd.) and stirring the mixture was applied on the upper end face excluding the notched parts of the pellicle frame so as to have a width of 1 mm and a thickness of 0.1 mm. Further, as a mask pressure-sensitive adhesive, one obtained by adding 0.1 part by weight of a curing agent (L-45 manufactured by Soken Chemical & Engineering Co., Ltd.) into 100 parts by weight of an acrylic pressure-sensitive adhesive agent (SK-1495 manufactured by Soken Chemical & Engineering Co., Ltd.) and stirring the mixture was applied over the entire circumference on a lower end face of the pellicle frame so as to have a width of 1 mm and a thickness of 0.1 mm.

After that, the pellicle frame was heated at 90° C. for 12 hours to cure the pressure-sensitive adhesive on the upper end face and lower end face of the pellicle frame. Subsequently, an ultrathin silicon film was used as a pellicle film, and the ultrathin silicon film was press bonded to the pressure-sensitive adhesive formed on the upper end face of the pellicle frame, and a pellicle was completed.

The pellicle was attached onto a quartz mask with a size of 150 mm×150 mm as a substitute for a photomask.

Example 2

A pellicle frame (with an outer size of 150 mm×118 mm×1.5 mm, and a frame width of 4 mm) made of titanium was prepared.

In an outer side face of a long side of the pellicle frame, two jig holes each having a diameter of 1 mm and a depth of 1.2 mm were provided at two places each with a distance of 52 mm away from the center of the side to each of the corner directions. In an upper end face of each of the long sides of the pellicle frame, two notched parts each with a width of 50 mm, a height of 0.1 mm and a depth of 4 mm were provided at two places with a space of 15 mm. In an upper end face of each of the short sides of the pellicle frame, two notched parts each with a width of 40 mm, a height of 0.1 mm and a depth of 4 mm were provided at two places with a space of 15 mm. These notched parts were each formed from an outer side face up to an inner side face.

The pellicle frame was cleaned, and one obtained by adding 1 part by weight of a curing agent (PT-56 manufactured by Shin-Etsu Chemical Co., Ltd.) into 100 parts by weight of a silicone pressure-sensitive adhesive (X-40-3264 manufactured by Shin-Etsu Chemical Co., Ltd.) and stirring the mixture was applied on the upper end face excluding the notched parts of the pellicle frame so as to have a width of 1 mm and a thickness of 1 mm. Further, a silicone pressure-sensitive adhesive similar to the above pressure-sensitive adhesive was also applied over the entire circumference on a lower end face of the pellicle frame so as to have a width of 1 mm and a thickness of 1 mm.

After that, the pellicle frame was heated at 90° C. for 12 hours to cure the pressure-sensitive adhesive on the upper end face and lower end face of the pellicle frame. Subsequently, an ultrathin silicon film was used as a pellicle film, and the ultrathin silicon film was press bonded to the pressure-sensitive adhesive formed on the upper end face of the pellicle frame, and a pellicle was completed.

The pellicle was attached onto a quartz mask with a size of 150 mm×150 mm as a substitute for a photomask.

Comparative Example 1

A pellicle frame (with an outer size of 150 mm×118 mm×1.5 mm, and a frame width of 4 mm) made of titanium was prepared. Instead of providing a notched part on each side of the pellicle frame, through holes each having a diameter of 0.8 mm were provided at 20 positions on each side as ventilation parts. The constitution except for the constitution described above was the same as the constitution of Example 1.

Comparative Example 2

A pellicle frame (with an outer size of 150 mm×118 mm×1.5 mm, and a frame width of 4 mm) made of titanium was prepared. The constitution was the same as the constitution of Example 1 except that a notched part was provided at the center of each side in the lower end face of the pellicle frame.

The pellicle of each example of Examples 1 and 2 and Comparative Examples 1 and 2 was subjected to the following attachment stability test, ventilation test, and foreign matter inspection after cleaning. The evaluation results are shown in Table 1.

[Attachment Stability Test]

A pellicle attached to a quartz substrate was placed so that the pellicle was positioned on the lower side, heated to 80° C. in an oven, and left to stand for 1 week, and the presence or absence of the dropping of the pellicle was confirmed. As a result, only the pellicle of Comparative Example 2 was dropped.

[Ventilation Test]

A pellicle attached to a quartz substrate was placed in a vacuum device, and the pressure was reduced to 1E-4 ($1.0 \times 10^{-4}$) Pa in 1 minute. After that, the pressure was returned to an atmospheric pressure over 2 minutes, and the state of the pellicle film was confirmed. In all of the pellicle films of Examples 1 and 2 and Comparative Examples 1 and 2, abnormality was not confirmed.

[Foreign Matter Inspection after Cleaning]

After cleaning a pellicle frame, adhered foreign matters on a surface of the pellicle frame was inspected by using a condensing light under a fluorescent lamp and in a dark room, and the adhered foreign matters were not confirmed in all of the pellicle films of Examples 1 and 2 and Comparative Examples 1 and 2.

In Comparative Example 1, since the presence or absence of foreign matters inside a through hole cannot be confirmed by visual inspection, the presence or absence of foreign matters inside the through hole was confirmed by using a microscope after cleaning the pellicle frame. Of the 80 through holes, a foreign matter with a size of around 100 μm was found in two through holes. Further, since the visual observation was performed by using a microscope, many foreign matters adhered to a surface of the pellicle frame due to the use of the microscope.

TABLE 1

|  | Material | Attachment stability | Ventilation characteristic | Foreign matter inspection |
| --- | --- | --- | --- | --- |
| Example 1 | Titanium | ○ | ○ | ○ |
| Example 2 | Titanium | ○ | ○ | ○ |
| Comparative Example 1 | Titanium | ○ | ○ | x |
| Comparative Example 2 | Titanium | x | ○ | ○ |

From the above Table 1, in each of the pellicles of Examples 1 and 2, by using a pellicle frame having a notched part in an upper end part of the pellicle frame, the foreign matter inspection can be more easily performed as compared with the pellicles of Comparative Examples 1 and 2, and it can be understood that the attachment stability is favorable, and the ventilation ability is sufficient.

Japanese Patent Application No. 2019-016992 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pellicle comprising:
   a pellicle frame having a frame shape, an upper end face and a lower end face to face a photomask; and
   a pellicle film arranged at the upper end face of the pellicle frame, wherein the pellicle frame is provided with at least one recessed portion from an outer side face toward an inner side face of the upper end face, and wherein the recessed portion is a ventilation part.

2. The pellicle according to claim 1, wherein the recessed portion is formed from the outer side face up to the inner side face.

3. The pellicle according to claim 1, wherein the pellicle frame has a thickness of less than 2.5 mm.

4. The pellicle according to claim 1, wherein an adhesive agent or a pressure-sensitive adhesive is provided on the upper end face of the pellicle frame excluding the recessed portion in the upper end face of the pellicle frame.

5. The pellicle according to claim 1, wherein a curved part is not formed in a ventilation passage of the ventilation part.

6. The pellicle according to claim 1, wherein the pellicle is applied to EUV.

7. An assembly comprising the pellicle of claim 1 and an exposure original plate, wherein the pellicle is attached to the exposure original plate.

8. An exposure method, comprising performing an exposure using the assembly according to claim 1.

9. A manufacturing method of a semiconductor device, comprising a step of forming a pattern by irradiating a semiconductor wafer with light wherein the assembly according to claim 7 is adopted.

10. The pellicle according to claim 1, wherein the pellicle film is arranged on the upper end face of the pellicle frame.

* * * * *